US006238850B1

(12) United States Patent
Bula et al.

(10) Patent No.: US 6,238,850 B1
(45) Date of Patent: May 29, 2001

(54) METHOD OF FORMING SHARP CORNERS IN A PHOTORESIST LAYER

(75) Inventors: Orest Bula, Shelburne; Daniel Cole, Jericho; Edward Winston Conrad, Jeffersonville; William Charles Leipold, Enosburg Falls, all of VT (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/379,454

(22) Filed: Aug. 23, 1999

(51) Int. Cl.[7] ........................................ G03C 5/00
(52) U.S. Cl. .................. 430/394; 430/5; 430/311; 430/312
(58) Field of Search ................. 430/394, 5, 311, 430/312

(56) References Cited

U.S. PATENT DOCUMENTS

| 4,591,540 | 5/1986 | Bohlen et al. | 430/311 |
|---|---|---|---|
| 5,286,584 | 2/1994 | Gemmink et al. | 430/5 |
| 5,308,741 | 5/1994 | Kemp | 430/312 |
| 5,340,700 | 8/1994 | Chen et al. | 430/312 |
| 5,424,154 | 6/1995 | Borodovsky | 430/5 |
| 5,532,090 | 7/1996 | Borodovsky | 430/5 |
| 5,563,012 | 10/1996 | Neisser | 430/311 |
| 5,620,816 | 4/1997 | Dao | 430/5 |
| 5,702,868 | * 12/1997 | Kellam et al. | 430/312 |
| 5,804,339 | 9/1998 | Kim | 430/5 |
| 5,807,649 | 9/1998 | Liebmann et al. | 430/5 |
| 5,851,707 | 12/1998 | Shibuya et al. | 430/5 |
| 5,863,677 | * 1/1999 | Nakao | 430/5 |

\* cited by examiner

*Primary Examiner*—Geraldine Letscher
(74) *Attorney, Agent, or Firm*—Scully, Scott, Murphy & Presser; William D. Sabo, Esq.

(57) ABSTRACT

A method of forming an image having reduced corner rounding in a photoresist layer is provided which comprises exposing a photoresist layer to a first mask having a first image, said first image having at least two edges; exposing said photoresist layer to a second mask having a second image, said second image having at least two edges, the second image edges being substantially rotated relative to the first image edges to produce a latent image in said photoresist layer having edges substantially rotated relative to the first and second image edges; and developing the photoresist layer to produce said image.

12 Claims, 10 Drawing Sheets

METHOD OF FORMING SHARP CORNERS IN A PHOTORESIST LAYER

DESCRIPTION

Field of the Invention

The present invention broadly relates to the field of lithography; and more particularly, to a method of reducing corner rounding on very small images, i.e. images that are near the resolution limit of the optical system. The present invention also offers an alternative method of proximity correction especially useful for very small images.

Background of the Invention

In the field of integrated circuits (ICs), photolithography is used to transfer patterns, i.e. images, from a mask containing circuit-design information to thin films on the surface of a substrate, e.g. Si wafer. The pattern transfer is accomplished with a photoresist (an ultraviolet light-sensitive organic polymer). In a typical image transfer process, a substrate that is coated with a photoresist is illuminated through a mask and the mask pattern is transferred to the photoresist by chemical developers. Further pattern transfer is accomplished using a chemical etchant.

In current technologies, the masking process usually is repeated multiple times in the fabrication of an integrated circuit. For example, pattern transfer may be accomplished by either a 5X reduction step and repeat, or a 4X reduction step and scan exposure systems using short wavelength ultraviolet light.

It is well known in the field of microphotolithiography that very small images (on the order of 0.25 µm or below) print with rounded corners. In extreme cases, square vias print as round openings in the photoresist. For rectangular shapes, a prior art technique referred to as serifing can be used. In this prior art technique, if the desired image is a bar-like structure similar to the character "|", then serifs are added to the mask image making it look similar to the letter "I". This method reduces foreshortening, but there is still a degree of corner rounding present.

Another prior art technique for reducing corner rounding on a transferred image is to reduce the wavelength of the light used in the imaging process. Both of the above mentioned techniques have limits associated therewith. For example, reducing the wavelength of light used for imaging runs up against photoresist formulation and optical problems, including reduced DOF and limited equipment availability. Adding serifs can become data intensive, requiring very large data sets. Smaller serifs are also difficult to fabricate and inspect on a mask, for example placing four 0.1×0.1 µm serifs on the corners of a 0.25×0.25 µm via is very difficult to inspect with current equipment capabilities.

In view of the above mentioned drawbacks with prior art techniques, there remains a need for providing a new and improved photolithographic method which can be used in providing an image on a photoresist coated surface that has very sharp corners associated therewith. That is, a method is required which is capable of reducing corner rounding on images that are near the resolution limit of the optical system used for pattern transfer.

SUMMARY OF THE INVENTION

One object of the present invention is to provide a photolithographic method which is capable of providing an image on a photoresist layer that has sharp corners, i.e. reduced corner rounding, associated therewith.

Another object of the present invention is to provide a method which is capable of proximity correction of very small images.

A further object of the present invention is to provide a method of forming transferred images that are near the resolution capabilities of the optical system.

A yet further object of the present invention is to provide a method of pattern transfer wherein conventional photoresist, i.e. photosensitive, materials and/or optical systems are used.

An added benefit of the present invention is the elimination of mask process induced corner distortion (i.e. corner rounding) on the resulting printed image.

These and other objects and advantages can be obtained in the present invention by utilizing a double exposure method wherein the masks used for pattern transfer are orientated in a fashion such that the latent image has edges at a substantial rotation relative to edges on the masks. Specifically, the method of the present invention, which provides an image in a photoresist (or photosensitive) layer using double exposure, comprises:

exposing a photoresist layer to a first mask having a first image, said first image having at least two edges;

exposing said photoresist layer to a second mask having a second image, said second image having at least two edges, the second image edges being substantially rotated with respect to the first image edges to produce a latent image in said photoresist layer having edges at a substantial angle relative to the first and second image edges; and developing the photoresist layer to produce said image in said photoresist layer.

The pattern provided using the above described double exposure process may then be transferred to an underlying substrate by using conventional etching.

The present invention is capable of producing latent images that are shaped similar to a diamond, square or rectangle. The latent image produced may be isolated or nested in arrays or rows.

DETAILED DESCRIPTION OF THE INVENTION

Figure 1:
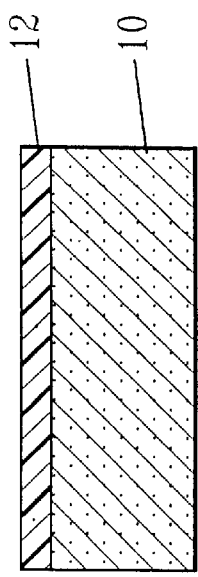
FIG. 1 is a cross-sectional view illustrating a structure having a photoresist layer on a surface of a substrate.

The present invention, which provides a photolithographic method of reducing corner rounding, will now be described in more detail by referring to the drawings that accompany the present application. It is noted that in the accompanying drawings like reference numerals are used for describing like and corresponding elements thereof.

In accordance with the present invention, an image having sharp corners is provided by first applying, as shown in FIG. 1, a photoresist 12 to a surface of a substrate 10. Substrate 10 employed in the present invention is any material that is capable of being patterned by lithography. For example, substrate 10 may be a semiconductor chip, wafer, interconnect structure, circuit board, metal layer, insulator or other like material in which an image can be formed thereon by lithography and etching. The substrate can be composed of, or contain, a semiconducting material such as Si, Ge, GaAs, InAs, InP or other like III/V compound. The substrate may contain active device regions, wiring regions, isolation regions or other like regions. For clarity these regions are not shown in FIG. 1.

The photoresist employed in the present invention may be composed of any conventional positive or negative resist material that is typically used in the field of lithography. A hybrid photoresist comprising a combination of negative and positive resist materials can also be employed in the present invention.

Photoresist 12 is formed on the surface of substrate 10 using conventional deposition processes that are well known in the art. For example, the photoresist may be applied by spin-on coating, dip coating, chemical vapor deposition, brushing, evaporation and other like deposition techniques.

It is noted that the present invention can be used in contact printing, proximity printing, or projection printing. In contact printing, the mask or masks are pressed upon the photoresist layer; in proximity printing, the mask(s) is positioned a short distance away from the photoresist layer; and in projection printing, an optical element for projecting the image of a mask to the photoresist layer is employed between the mask and the photoresist layer. Any conventional photo-optical exposure system may be employed in the present invention.

Notwithstanding which printing technique is employed, a first mask having a first image is next provided. The first mask is any conventional mask, including chrome on quartz or an attenuating phase shift mask, which contains at least two edges. FIGS. 2a and 3a illustrate some examples of the first mask 20 that can be employed in the present invention in which region 22 is the mask material and region 24 is the image to be transferred to the photoresist.

The image from the first mask is transferred to the photoresist by utilizing a partial exposure process wherein the dosage employed at a specific wavelength (within the resist absorption spectrum) is less than that which would provide full exposure of the same. A single, continuous pulse or multiple pulses may be employed in the present invention.

After the first image has been transferred to the photoresist layer, the first mask is removed, and a second mask 30 having a second image 34 having at least two edges is next provided. The second mask which is shown in FIGS. 2b and 3b is aligned with a substantial rotation to the first transferred image so that the latent image has edges that are substantially rotated relative to the first and second edges. The second mask may also be composed of conventional materials, e.g. chrome on quartz or an attenuating phase shift material.

As stated above, the second image edges are substantially rotated relative to the first image edges. The rotation can be any angle that is greater than 0°. For example, the rotation may be 0°, 20°, 30°, etc. Preferred rotations are from 45° to 90°.

The second image is then transferred to the photoresist utilizing a second partial exposure step. The second partial exposure step may be carried out using the same or different dosage as the first partial exposure step. Again, a continuous energy pulse may be used in the second partial exposure step, or, alternatively, multiple energy pulses may be employed.

It should be noted that the first and second images have at least one overlapping region and at least one non-overlapping region. Typically, the non-overlapping region extends outward from the overlapping region by an amount that is greater than the wavelength of the exposure system. In other embodiments, the non-overlapping region is approximately the wavelength of the exposure system, or it is less than the wavelength of the exposure system, but greater than 0.

After the second exposure step, the latent image 40 in the photoresist is then developed using an appropriate developer. The kinds of developers that can be employed in the present invention are well known to those skilled in the art and are dependent on whether a positive or negative photoresist is employed.

The above provides a brief description of the first and second masks that can be employed in the present invention, a more complex description of the same follows herein below.

Figure 2C:
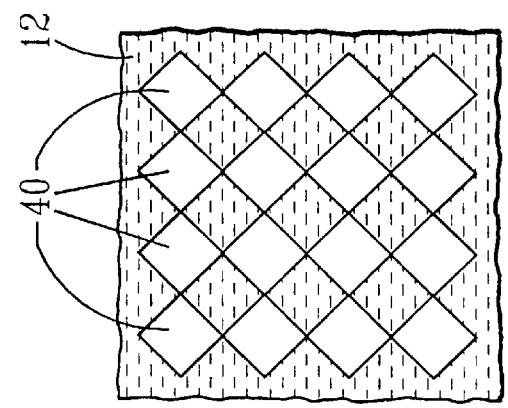
FIGS. 2a–c are top views illustrating: (a) a first mask, (b) a second mask, and (c) the image produced by the same after conducting the double exposure process of the present invention.
Figure 2B:
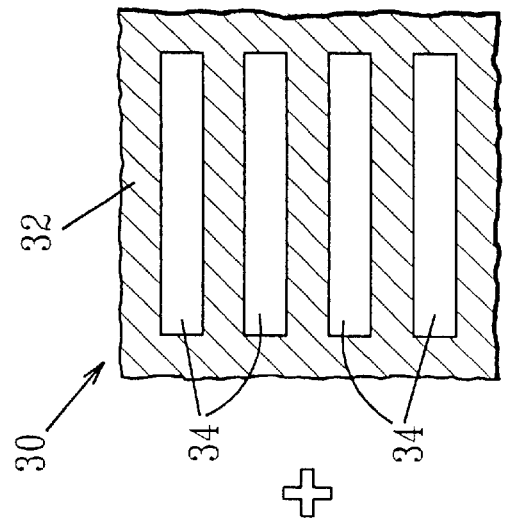
Figure 2A:
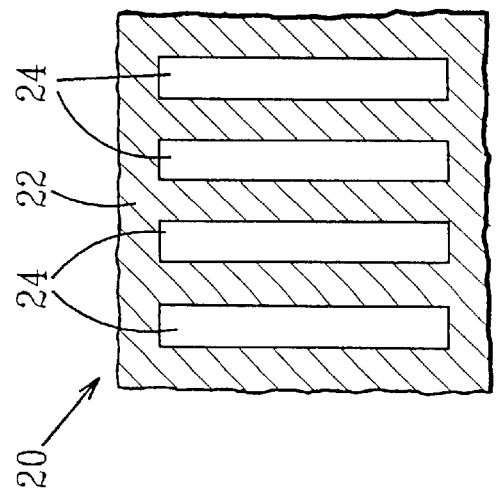

FIGS. 2a–c show first mask 20 having vertical clear bars 24 and second mask 30 having horizontal clear bars 34 producing a printed image 40 (FIG. 2c) in a positive photoresist layer 12 which is an array of diamonds (squares turned 45° from the mask image bars). Each mask was exposed with a sub-threshold dose of energy so the photoresist only sees sufficient energy for complete exposure in the overlap. One would expect a square to be produced, but instead a diamond shaped image is printed due to overlapping intensity distributions of the overlapping exposures. Therefore the process sequence is underexpose mask 20, underexpose mask 30, develop. Of course, turning the mask images by 45°, results in an array of squares.

Figure 3C:
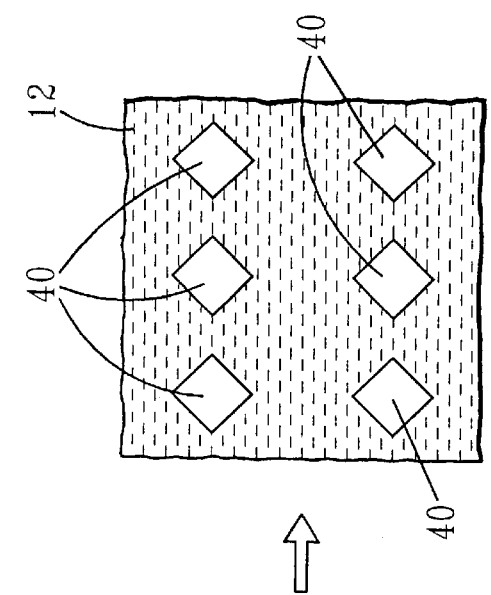
FIGS. 3a–c are top views illustrating: (a) a first mask, (b) a second mask, and (c) the image produced by the same after conducting the double exposure process of the present invention.
Figure 3B:
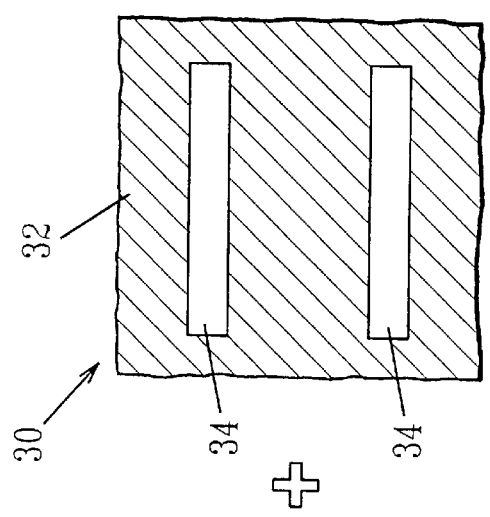
Figure 3A:
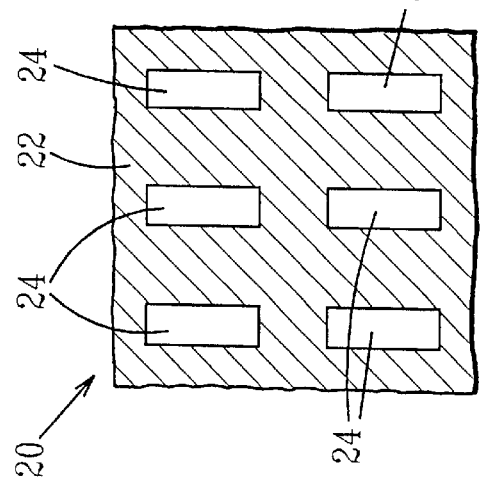

While an array of images may not always be useful, rows, and individual square images can be produced. This is illustrated in FIGS. 3a–c. A mask 20 having broken vertical clear bars 24 and mask 30 having horizontal clear bars 34 produces a printed image 40 in a positive photoresist layer which is a row of diamond shapes. Individual diamond shapes could be produced by this technique as well.

Figure 4:
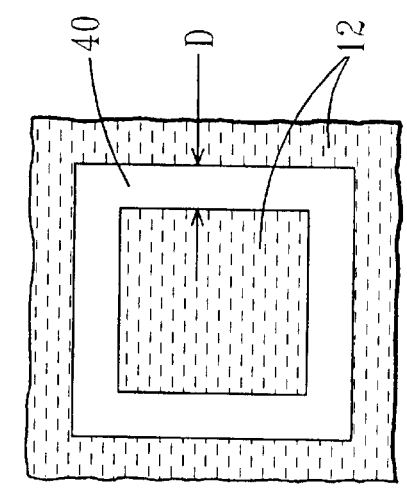
FIG. 4 illustrates a top view of an image that can be produced using the method of the present invention using a hybrid positive-negative photoresist.

When a hybrid resist (a mixture of positive and negative resists) is exposed with this technique, images such as shown in FIG. 4 can be fabricated where the distance "D" is a sub-resolution image.

Figure 5:
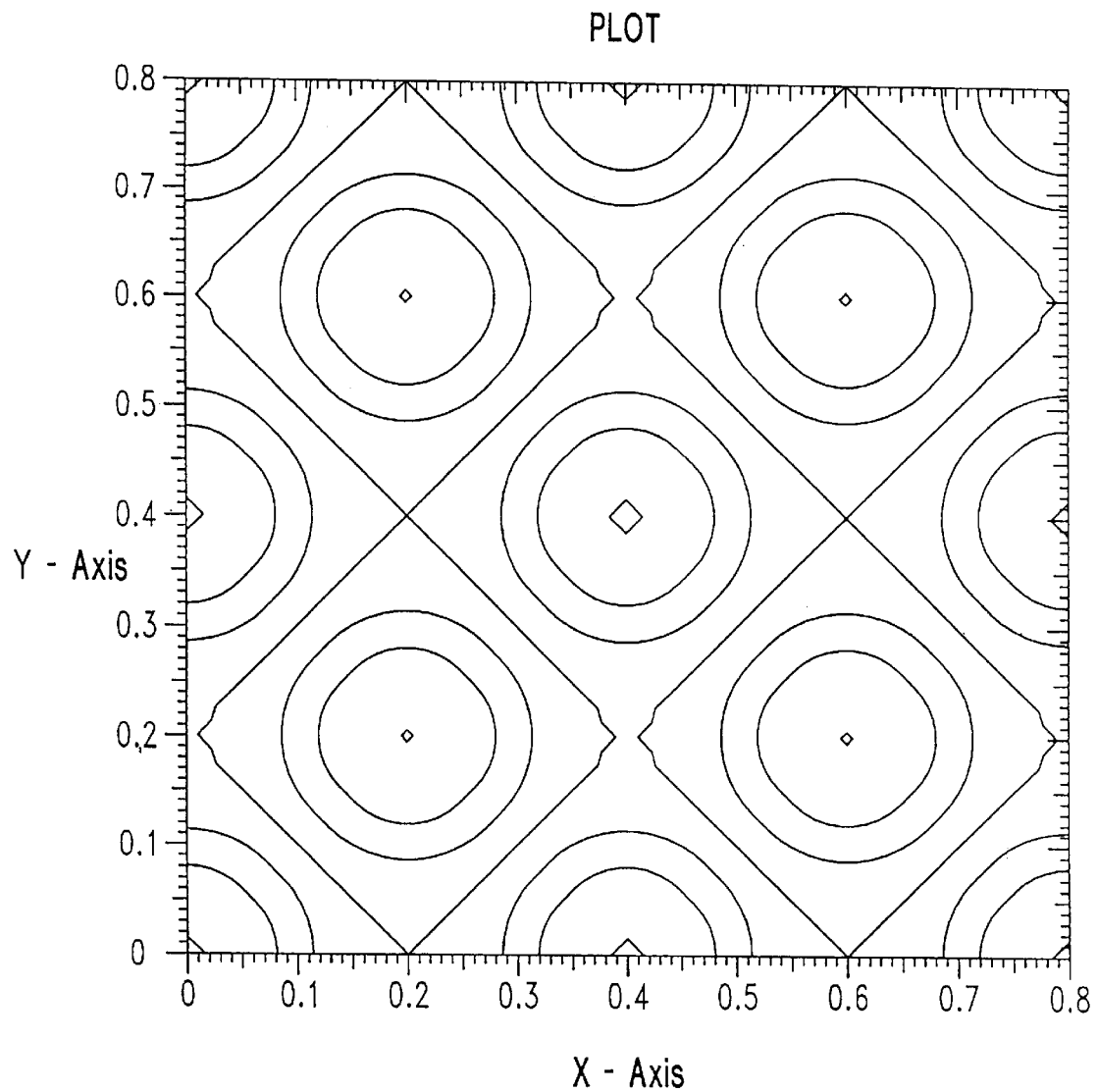
FIG. 5 is a modeled topographical exposure map (0.1 increments) of an image provided by the method of the present invention.
Figure 6:
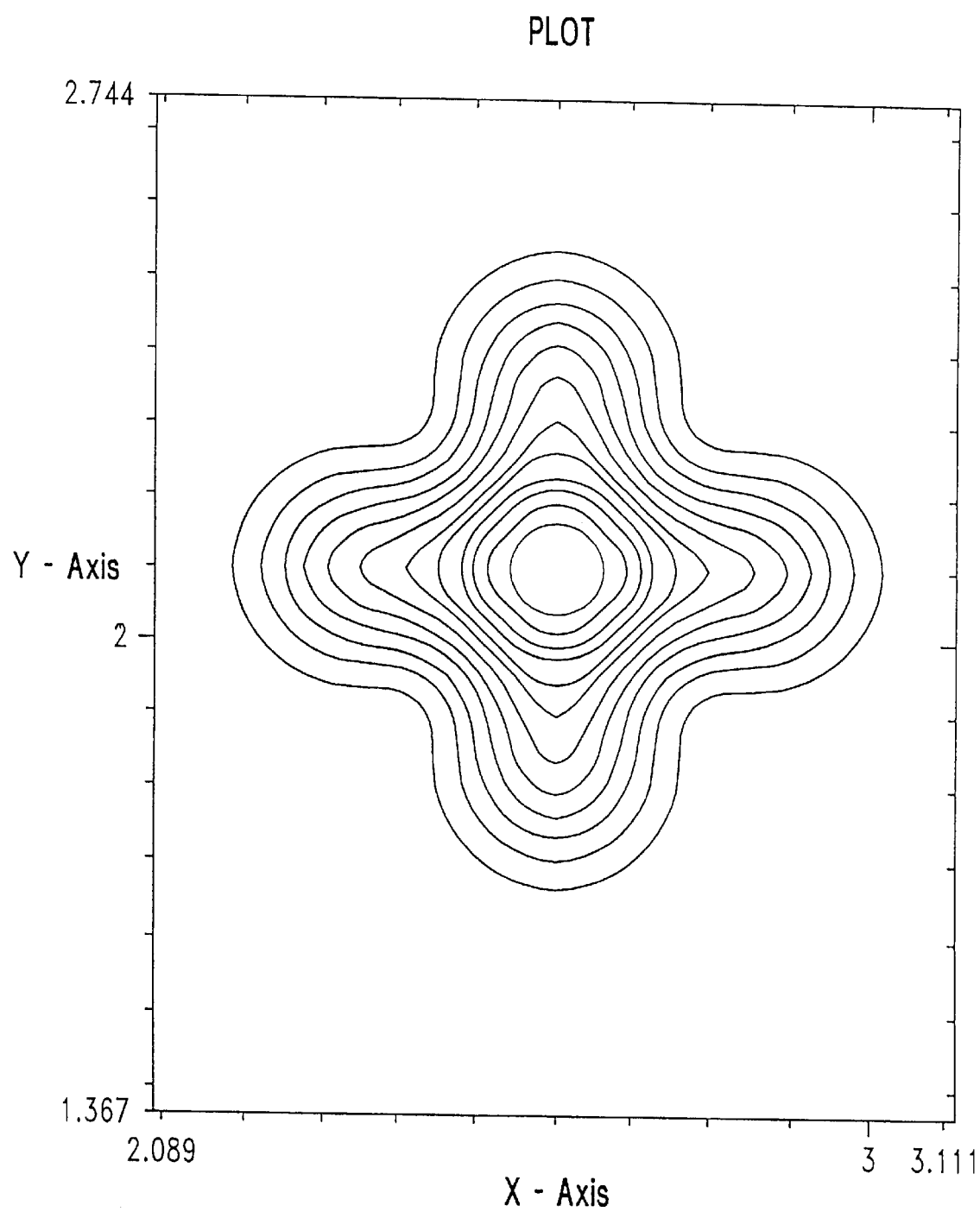
FIG. 6 is a modeled topographical exposure map (0.1 increments) of an isolated image provided by the method of the present invention.

FIGS. 5 and 6 are modeled topographical exposure maps of the invention. FIG. 5 models the case described in FIGS. 2a–c and FIG. 6 models the case described in FIGS. 3a–c. The modeling technique used combines a software program called Fast Aerial Image Model (FAIM) which is commercially available with software that applies photoresist sensitizer diffusion effects to the latent image. The dose contour which defines the desired printed image for case 1 (contour 0.6 in FIG. 5) is about 30% of full exposure and similarly is about 35% of full exposure case 2 (contour 0.7 in FIG. 6). Simulations show that the invention is relatively insensitive to defocus in the range of 0 to 0.5 $\mu$m for periodic array shapes. Also, simulations at different sensitizer diffusion lengths (0–0.15 $\mu$m) show the same insensitivity but over a lesser range of tolerable exposure.

Figure 7:
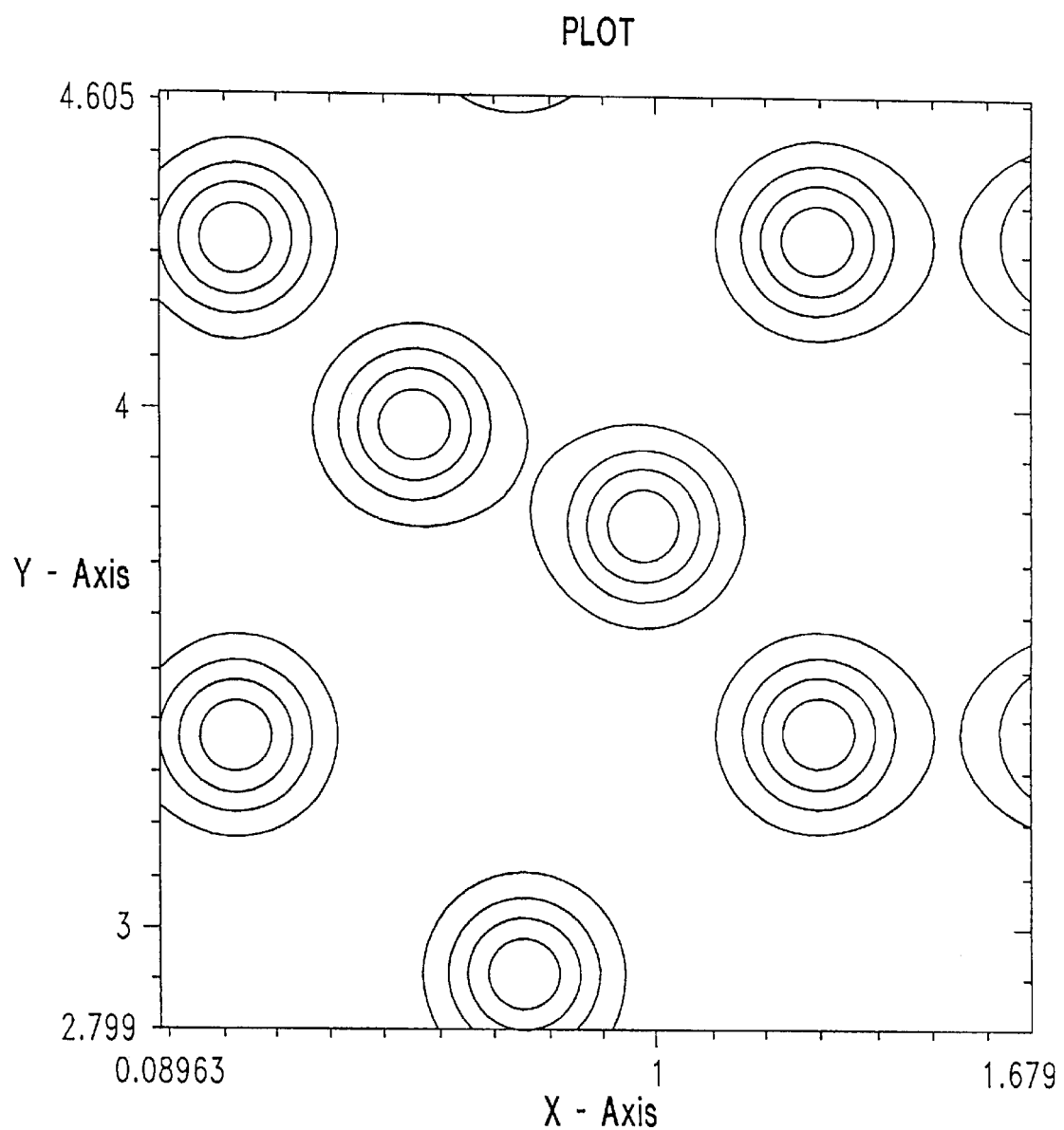
FIG. 7 is a modeled aerial image (0.5 increments) of two contacts in relatively close proximity to each other that were produced using conventional (prior art) lithography techniques.
Figure 8:
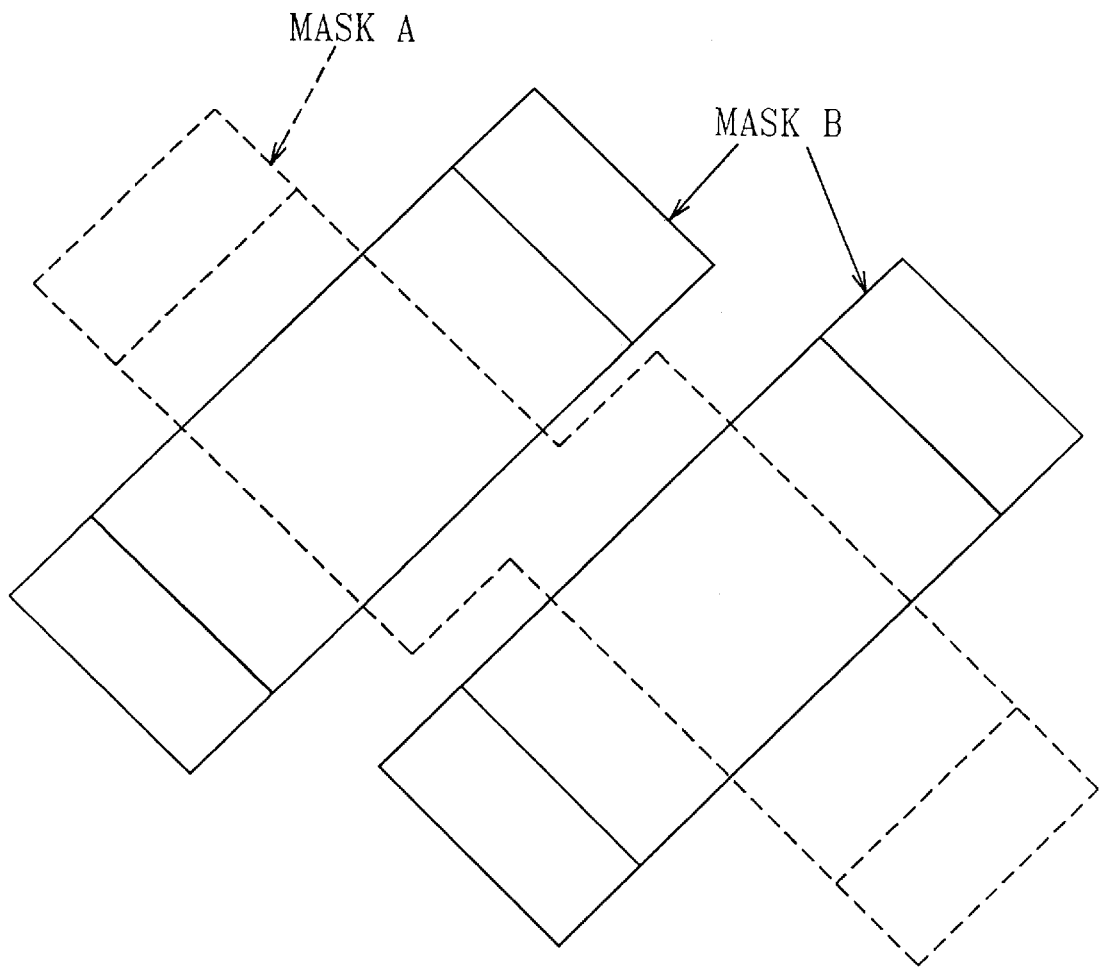
FIG. 8 is a design of mask shapes that can be used in the present invention.

FIG. 7 shows a modeled aerial image of 2 contacts in relatively close proximity to one another. The aerial image shown was produced by simulating a conventional photolithograhpy process. Application of the present invention to reduce corner rounding can be achieved by two exposures of the mask shapes shown in FIG. 8.

Figure 9A:
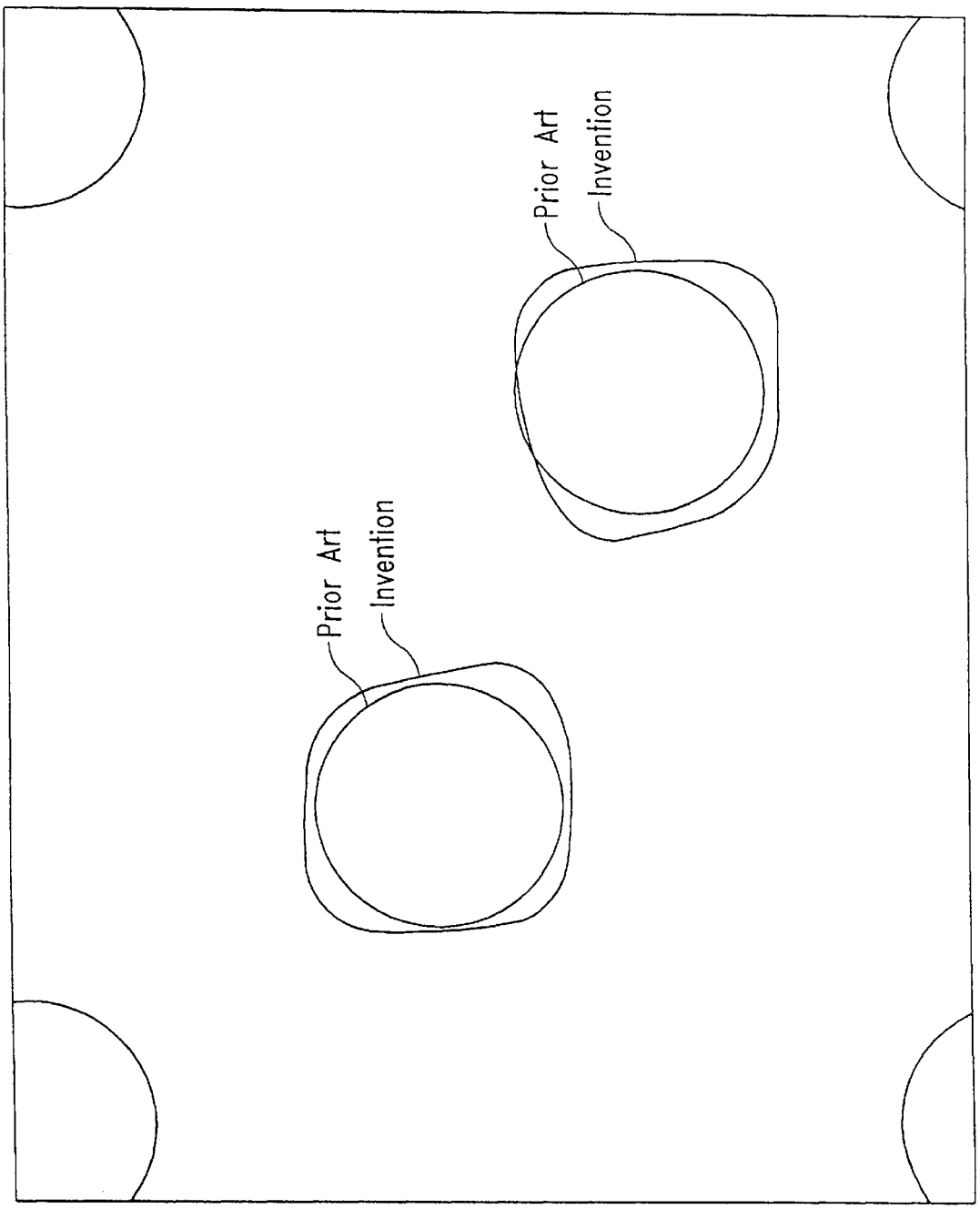
FIGS. 9a–b show a simulated wafer shape for a conventional exposure (reference FIG. 7) and the exposure made according to the present invention (reference FIG. 8) at (a) 0 μm defocus and (b) 0.4 μm defocus.
Figure 9B:
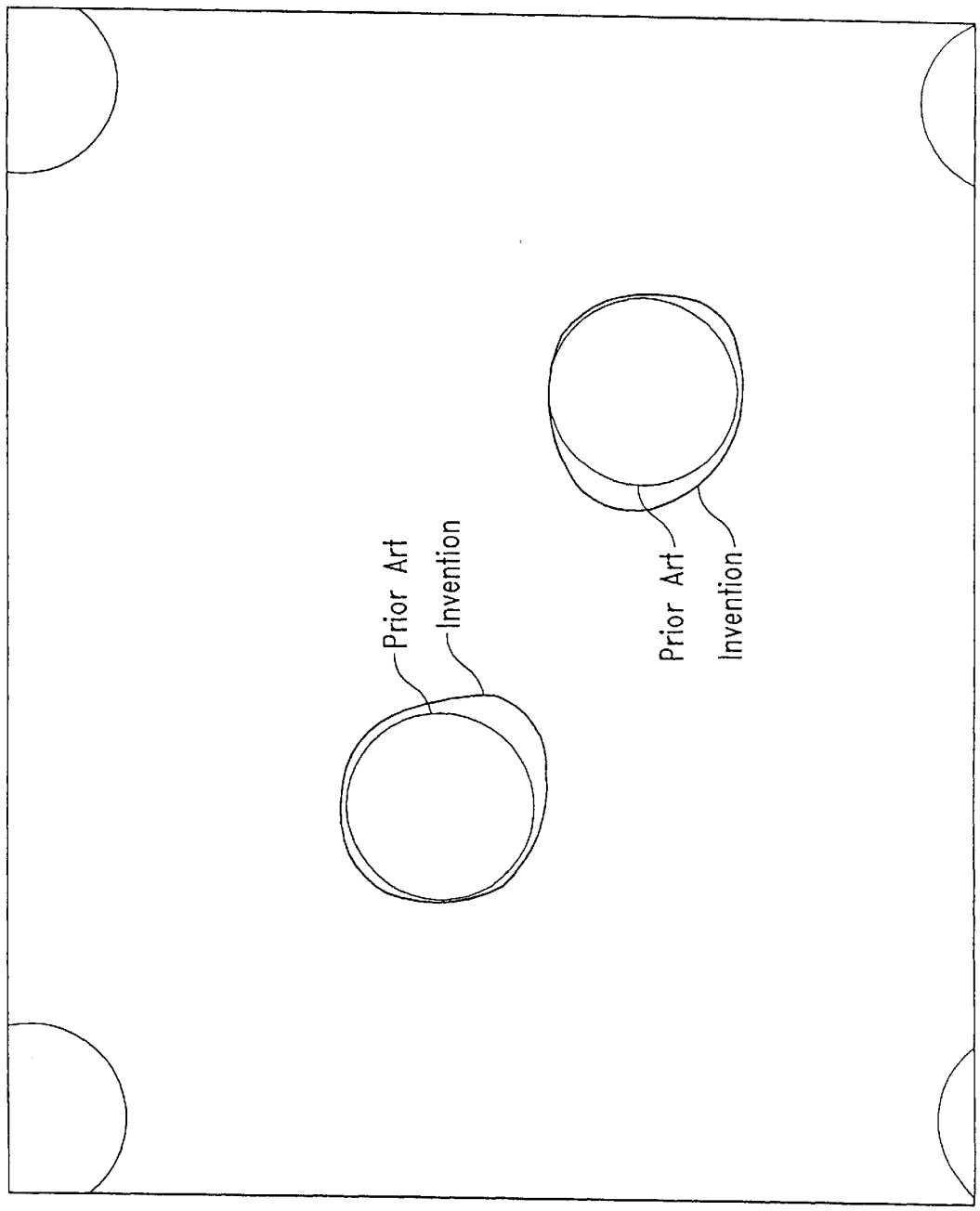

FIGS. 9a–b show the simulated wafer shape for a conventional exposure and the exposure made according to the present invention. Simulated wafer shapes for 0 $\mu$m defocus (FIG. 9a) and 0.4 $\mu$m defocus (FIG. 9b) are shown. For both defocus conditions, the method of the present invention results in reduced corner rounding which ultimately will allow greater contact area with the previous and subsequent levels.

Figure 10:
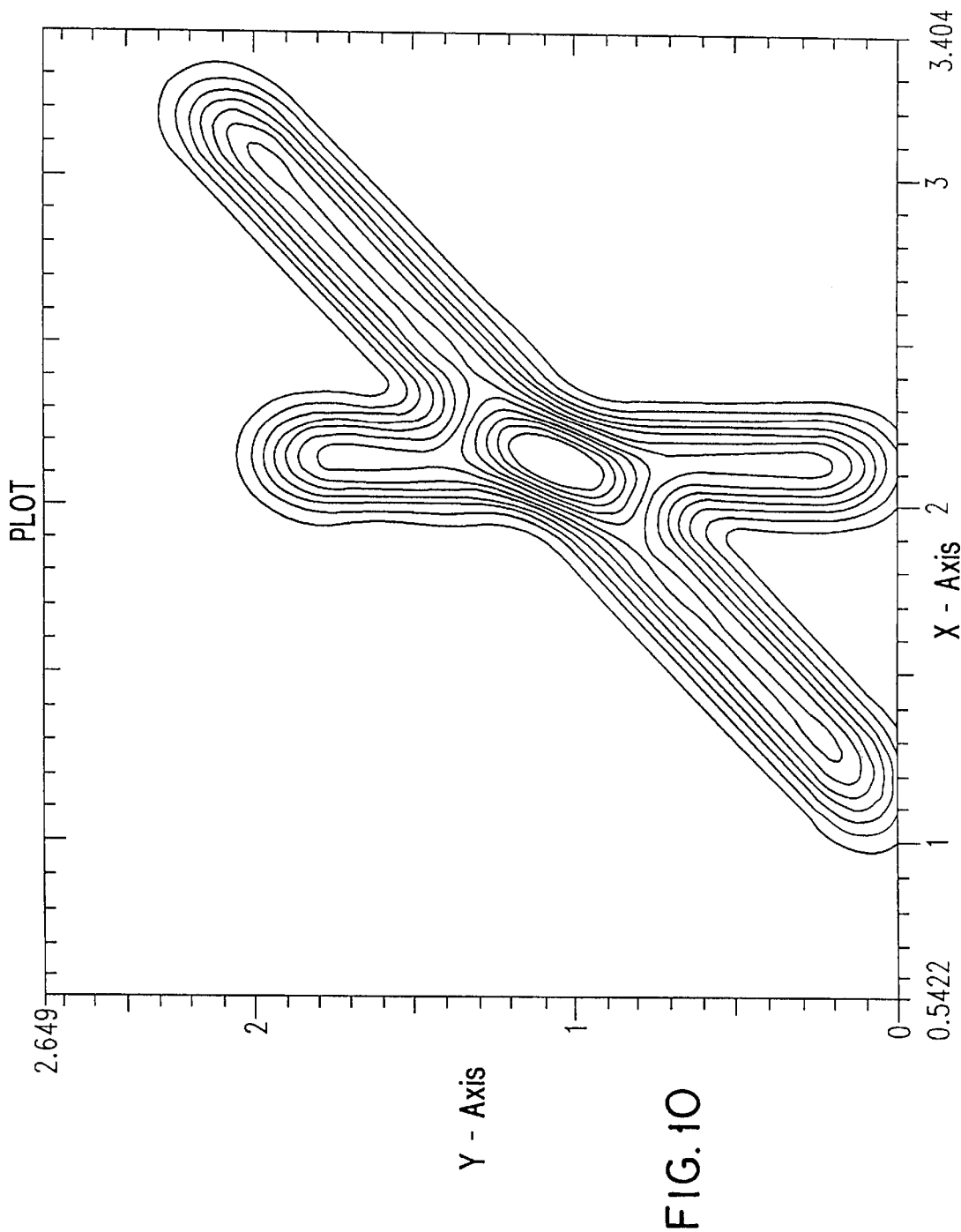
FIG. 10 is a modeled topographical exposure map (0.1 increments) of an isolated image provided by the present invention wherein the shapes are other than 90 °.
Figure 11:
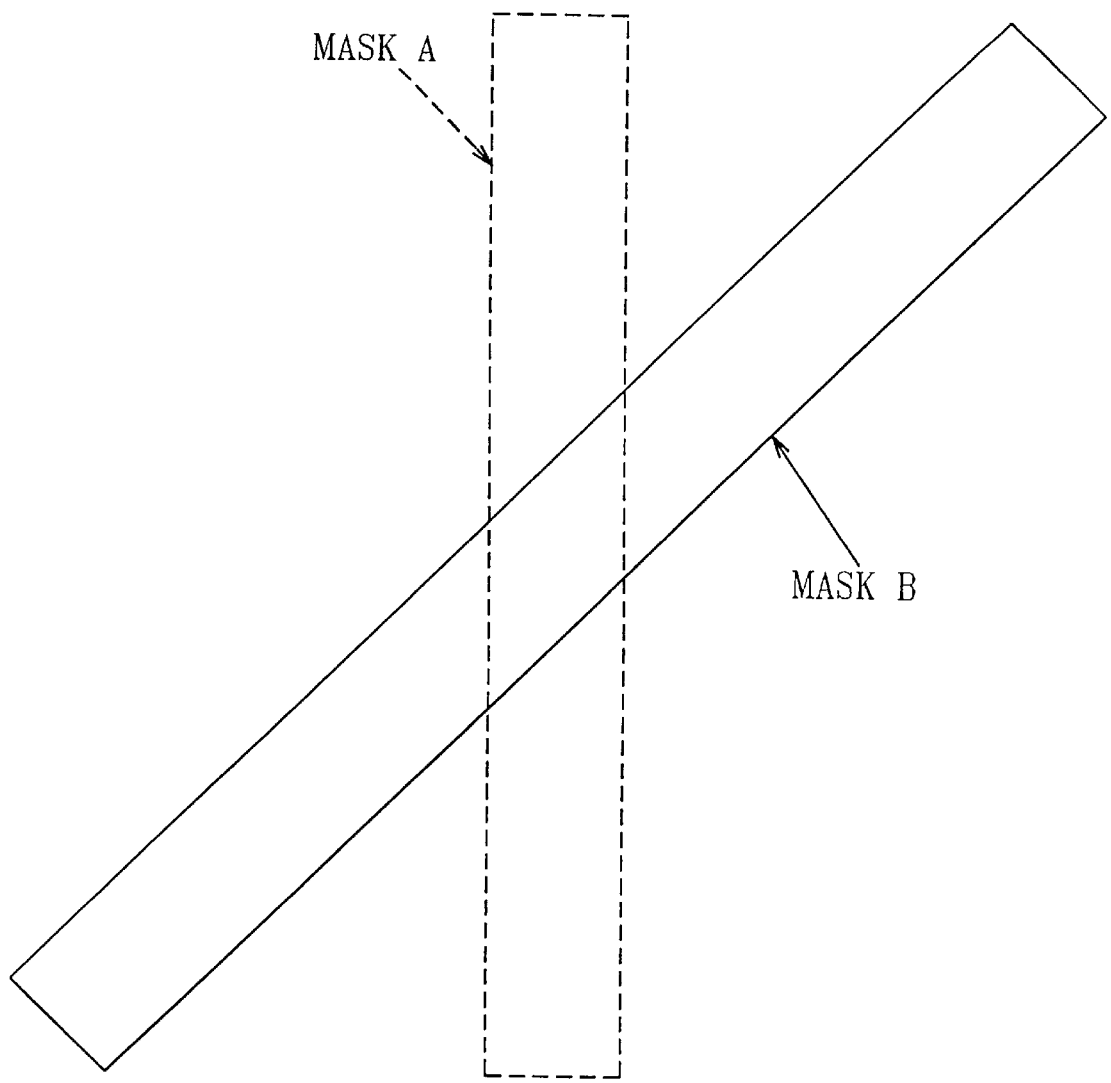
FIG. 11 is a design of mask shapes used in producing the image of FIG. 10.

FIG. 10 illustrates an embodiment of the present invention wherein the shapes produced are other than 90°; whereas FIG. 11 shows a design of mask shapes that can be used in producing the same. This embodiment of the present invention is capable of producing rectangular shaped structures.

The invention described herein enables the construction of photoresist structures with very square corners. These structures result by using a double exposure method that forces a very symmetric light intensity exposure to occur within the resist. More specifically, if one simply used a single exposure of a periodic pattern of contact openings in a mask, in an attempt to achieve a square-like pattern exposure of the resist, the wellknown limitations of diffraction would severely limit the ability to achieve this desired exposure pattern. Indeed, when trying to print small contact holes in the conventional way with a single exposure mask, with conventional numerical aperture (NA) projection tools used in microlithography (i.e., NA not near unity), using only opaque and clear openings in the mask, and when the printed contact hole size is sufficiently small to be on the order of lambda/(NA*R), then circular-like patterns are typically created. Here, lambda is the wavelength of the light being used to expose the resist, NA is the numerical aperture of the projection stepper, and R is the "geometrical reduction projection factor" (usually between 1 and 20) between the actual (larger) size on the mask versus what is printed in the photoresist. In contrast, the invention described herein forces very squarelike patterns to be produced, due to the symmetry imposed on the exposure pattern. Indeed, the inventive method yields square-like exposure patterns for extremely small contact holes, simply by making the width and periodic spacing of the lines used in each mask exposure to be sufficiently small. More specifically, diffraction does not limit the formation of the square-like intensity pattern at nearly any dimension. The only real limitation to printing these square-like structures is that for small enough lines, the contrast between the maximum intensity and the minimum intensity becomes very small. If the photoresist is not sufficiently sensitive to differentiate between small changes in exposure, then the pattern of contacts will not print, despite the net intensity pattern being square-like. However, by improving on resist contrast sensitivities, one can take further advantage of the proposed double exposure technique to achieve decreasingly smaller square-like contact hole printability.

Thus, the present technique can achieve square-like intensity patterns of nearly any size for a regular grid of contacts. The limitation to being able to make the contact holes sufficiently small will largely reside with the resist contrast sensitivity. However, this method will certainly yield square-like patterns for contact holes of the size of lambda/ (NA*R), which improves beyond conventional capabilities that result in circular-like patterns being printed at this dimension.

While this invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms described and illustrated, but fall within the scope of the appended claims.

Having thus described our invention in detail, what we claim as new, and desire to secure by the Letters Patent is:

1. A method of forming an image in a photosensitive layer comprising the steps of:

first exposing a photoresist layer to a first mask having a first image, said first image having at least two edges and wherein first exposing step is a partial exposure step which is carried out using a dose of electromagnetic energy having a predetermined wavelength said dose being less than the full dose required for full exposure of said photoresist layer;

second exposing said photoresist layer to a second mask having a second image, said second image having at least two edges, the second image edges being substantially rotated relative to the first image edges to produce a latent image in said photoresist layer having edges substantially rotated relative to the first and second image edges, said second exposing step is a partial exposure step which is carried out using a dose of electromagnetic energy having a predetermined wavelength, said dose of electromagnetic energy being less than the full dose required for fill exposure of said photoresist layer; and developing the photoresist layer to produce said image.

2. The method of claim 1 wherein said photoresist layer is a positive tone resist, a negative tone resist or a mixture thereof.

3. The method of claim 1 wherein said photoresist layer is fon-ned on a surface of a substrate, said substrate being selected from the group consisting of semiconductor wafers, chips, interconnect structures, circuit boards, metal layers and insulators.

4. The method of claim 1 wherein said first and second masks comprise chrome on quartz or an attenuating phase shift material.

5. The method of claim 1 wherein said exposing steps are carried out by contact printing, proximity printing, projection printing or any combination thereof.

6. The method of claim 1 wherein said first and second images have at least one overlapping region and at least one non-overlapping region.

7. The method of claim 6 wherein said non-overlapping region extends outward from said overlapping region by an amount greater than the wavelength of the exposure system.

8. The method of claim 7 wherein said non-overlapping region is approximately the wavelength of the exposure system.

9. The method of claim 7 wherein said non-overlapping region is less than the wavelength of the exposure system, and greater than 0.

10. The method of claim 1 wherein said second image edges are rotated relative to said first image edges by an angle from 45° to 90°.

11. The method of claim 1 wherein said latent image is an isolated image, an array of images, or rows of images.

12. The method of claim 1 wherein said latent image is diamond shaped, square or rectangular.

* * * * *

UNITED STATES PATENT AND TRADEMARK OFFICE
CERTIFICATE OF CORRECTION

PATENT NO. : 6,238,850 B1
DATED : May 29, 2001
INVENTOR(S) : O. Bula et al.

It is certified that error appears in the above-identified patent and that said Letters Patent is hereby corrected as shown below:

Title page,
Item [57] ABSTRACT, "comer" should read -- corner --

Column 1,
Lines 9, 59, and 67, "comer" should read -- corner --
Line 58, "comers" should read -- corners --

Column 2,
Line 13, "comer" should read -- corner --

Column 3,
Line 9, "90 °." should read -- 90°. --

Column 6, claim 3,
Line 61, "fon-ned" should read -- formed --

Signed and Sealed this

Eleventh Day of December, 2001

Attest:

NICHOLAS P. GODICI
*Attesting Officer*   *Acting Director of the United States Patent and Trademark Office*